DIGITAL DATA TRANSFER CIRCUIT UTILIZING TUNNEL DIODES

Filed Feb. 26, 1962

INVENTOR
LOUZELLE A. LUKE
BY Marvin Jacobson
ATTORNEY

United States Patent Office 3,274,555
Patented Sept. 20, 1966

3,274,555

DIGITAL DATA TRANSFER CIRCUIT UTILIZING TUNNEL DIODES

Louzelle A. Luke, Coon Rapids, Minn., assignor to Sperry Rand Corporation, New York, N.Y., a corporation of Delaware

Filed Feb. 26, 1962, Ser. No. 175,529
10 Claims. (Cl. 340—172.5)

This invention relates to digital data transfer circuits and more particularly to circuits for shifting digital data words.

The function of shifting is well-known in the data processing art. Briefly, a digital word stored in a multi-stage register, with each stage developing a signal in accordance with the value of the corresponding stored digit, is shifted by transferring the signal representation developed in each stage to another stage which is removed from the origin stage a preselected number of stages. For example, a word stored in a five stage register with the stages numbered 0–4, respectively, from right to left, will be shifted two positions left by transferring the signal representation of the digital value originally stored in stage 0 to stage 2, the signal from stage 1 to stage 3, etc. Where an end around shift is desired the signal originally contained in stage 4 will be transferred end around to stage 0 and the signal originally stored in stage 5 will be transferred end around to stage 1. Some data processing devices incorporate serial shifting wherein the signal representations are transmitted from each stage to the next adjacent stage and this is sequentially done a preselected number of times until the word has been shifted the desired number of places. Serial shifting is time consuming and where speed is of the essence, data processing circuits incorporating parallel transmission to effect shifting operations have been devised.

A circuit finding present-day widespread use is a shifting matrix comprising a plurality of switching circuits in an array of rows and columns. All of the digits in the word to be shifted are concurrently transmitted to the matrix and are selectively gated out of the matrix in their shifted format. Some of the shifting matrices developed incorporate diodes, transformer-diode combination, transistors, magnetic thin-film elements or relays as the basic switching elements in the switching circuits. Some of the deficiencies in matrices incorporating these types of shifting elements are their relatively slow response capabilities, that is, the lack of capability to respond to short duration pulses, power dissipation in passive elements thereby requiring amplification to overcome power loss, relatively high signal sensitivity so as to be unable to respond to relatively low level signals, and bistable properties in the switching elements which require the resetting of the switching circuits intermediate each shifting operation. Copending applications of Sanders, Serial No. 62,440, filed October 13, 1960, and of Parrott, Serial No. 118,096, filed June 19, 1961, both assigned to the same assignee of the instant application, describe shifting circuits, respectively incorporating the magnetic thin-film elements and transformer-diode combinations.

Therefore, it is a general object of this invention to provide an improved digital data shifting matrix.

A more specific object of this invention is to provide a shifting matrix which is responsive to relatively low level signal inputs.

Still another object of this invention is to provide a shifting matrix which incorporates passive switching devices but which does not require power amplification.

Yet another object of this invention is to provide a shifting matrix which achieves the objects listed above while providing high-speed response capabilities.

In a preferred embodiment of this invention the shifting circuit incorporated into the switching matrix utilizes a tunnel diode as the basic switching element. The switching circuit has two signal input terminals and the input signals are coupled from the terminals to the tunnel diode by resistors. Signals on these terminals provide the only energy required to place the switching circuit in operational state. One of the input terminals receives a signal representative of the data to be shifted and a shift control signal is applied to the other input terminal to selectively activate the tunnel diode in combination with the first input signal. The tunnel diode characteristics are such that the input signals in combination with the coupling resistances cause the tunnel diode to operate as a monostable device with at least two operational states. One operational state occurs when both input signals are applied to the input terminals while another operational state occurs when only one of the input signals is applied. The switching action of the tunnel diode in response to the input signals received results in an output signal which is coupled to an output device, such as a digital data storage register, via an impedance such as a backward diode. The backward diode is utilized for isolation purposes and because of its characteristics relative to signals of relatively low signal level only a relatively small degree of signal attenuation occurs when the signal passes through the backward diode. Since the switching circuit operational state is determined solely by the signal inputs, no other energizing source, such as a D.C. biasing source commonly used in the present day tunnel diode circuits, is required. The elimination of this biasing source and its resulting stand-by current reduces the power requirements of the shifting circuit of this invention during the period of time that it is not performing its shifting function.

These and other more detailed and specific objects and features will be disclosed in the course of the following specification, reference being had to the accompanying drawing, in which.

Figures 1, 2, 3:
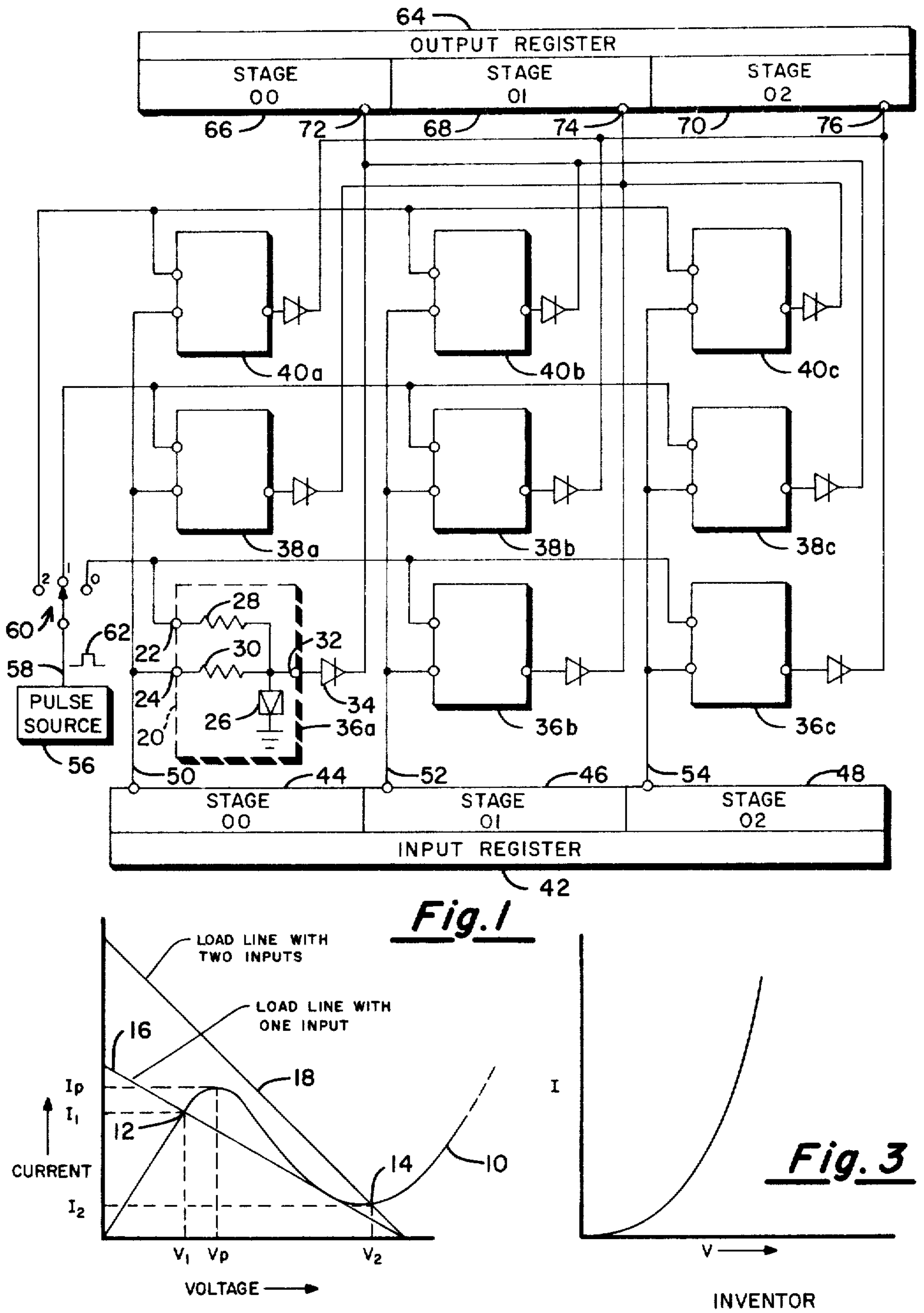
FIG. 1 is an embodiment of this invention.
FIG. 2 is a typical characteristic curve for a tunnel diode utilizable in the switching circuit of the embodiment shown in FIG. 1.
FIG. 3 is a typical characteristic curve for a backward diode.

In FIG. 2, curve 10 is the well known V-I characteristic curve for a typical tunnel diode. The V-I reationship is substantially linear from the origin as a positive signal input is applied to the anode of the tunnel diode until a peak current, $I_P$, is reached and then the tunnel diode operates in its negative resistance region. The two points, 12 and 14, on the characteristic curve, corresponding respectively to $I_1V_1$ and $I_2V_2$, represent two operational states of the tunnel diode. The first state, point 12, is a relatively low voltage operational state and point 14 is a relatively high voltage operational state. The two load lines, 16 and 18, are selected in the well-known manner to intersect the characteristic curve 10 respectively at points 12 and 14 so that depending upon the number of input signals applied to the tunnel diode its operational state will alternate between said two points on the characteristic curve.

Referring now to FIG. 1, the switching circuit, **36*a*, utilized in the exemplary embodiment of this invention is shown schematically enclosed in dotted line 20. All of the switching circuits are identical so only one will be described and is shown in detail and the others are represented by boxes. The two input terminals, 22 and 24, are connected to the anode of the tunnel diode 26, respectively, by resistors 28 and 30. The negative electrode of the tunnel diode, the cathode, is connected to a reference potential ground which is shown in the well-known manner to provide a common signal return path. The junction of resistors 28 and 30 and the anode of the tunnel diode is directly connected to the output terminal 32. The resistance values of resistors 28 and 30 are selected in conjunction with the applied input signal levels such that they provide the two loadlines 16 and 18, shown in FIG. 2. When signal inputs of a predetermined level are applied to both of the input terminals 22 and 24, the values of the two resistors are such that the load line is as shown in FIG. 2 as load line 18 which intersects the tunnel diode characteristic curve at point 14. With only one input signal applied to the switching circuit, either to input terminal 22 or 24, the effective loadline is loadline 16 of FIG. 2. which places the tunnel diode at its low voltage operational point 12. With a single input signal applied, the tunnel diode will operate at point 12 in its characteristic curve and upon concurrent application of a second input signal to the other input terminal the operation of the tunnel diode will switch to point 14, its high voltage operational state. Upon removal of one of these two input signals, the operational state of the tunnel diode will switch back to its low voltage operational state, point 12, on the characteristic curve. In this manner then the switching circuit is switchable between two operational states but exhibits monostable effects. Of course, it is recognized that if the signal inputs are removed from both input terminals the tunnel diode returns to a non-operational state at the origin of its characteristic curve. The signal appearing at the output terminal 32 will vary in accordance with the operational state of the diode. When the tunnel diode is in the low voltage operational state a relatively low signal output will appear at output terminal 32 whereas when the tunnel diode is in its high voltage operational state a relatively large magnitude output will occur at output terminal 32**. In this manner then, the output signal will be determinative of the combination of the input signals applied to the input terminals of the switching circuit.

The backward diode 34, shown by the well-known symbol, is connected to the output terminal 32 of the switching circuit. A typical V-I characteristic curve for a backward diode is shown in FIG. 3. It should be noted that the curves of FIG. 3 and FIG. 2 are not drawn to any scale but are only intended to show a typical characteristic operation of the devices. The characteristic of a backward diode which makes it preferable for use in the instant invention is its capability to respond to relatively low level signals applied. When biased in the forward direction so as to be in the conductive state by a signal applied thereto, the tunnel diode causes a relatively low voltage drop in the signal applied. For example, in a typical case the voltage drop through a backward diode will be approximately 90 millivolts as compared to approximately 400 millvolt drop of other semiconductor diodes. As is well-known in the art, a backward diode receives its name as such because of its physical formation.

In FIG. 1 a plurality of switching circuits 36*a*, *b*, and *c*, 38*a*, *b*, and *c* and 40*a*, *b*, and *c*, are arranged in a matrix array of three rows extending across and three columns extending vertically. Those switching circuits having the same letter designation are in a common column while those having the same number designation are in the same row. Each of the switching circuits contains the circuitry shown schematically as contained in broken line 20. An input register 42 comprising three register stages, 44, 46 and 48, temporarily stores the data which is to be shifted. For the purposes of the instant description, the data will be in the form of a binary word with each of the register stages storing one bit of the word in corresponding digit order positions with stage 00, 44, storing the lowest order bit. Each stage comprises any well-known bistable circuit, for example, a bistable transistor flip-flop, no limitation thereto intended. Each stage has means not shown for transferring new data thereto and for setting the stage to a state in accordance with the binary "1" or "0" value of the associated bit. Further, the input register 42 includes means for clearing the register by setting all of the stages to a state representative of a binary "0" value. Furthermore, each stage develops an output signal in accordance with its state which is representative of the value of the associated stored bit. For the purposes of the instant description it will be assumed that the output of the stages is a signal of a positive voltage level when in the binary "1" state and a signal of substantially zero or ground potential level when in binary "0" state. The output signal from stage 00, 44, which is representative of the binary value of that stage is transmitted to a first input terminal 22 of all of the switching circuits in the leftmost column of the matrix, 36*a*, 38*a* and 40*a*, via line 50. In a similar fashion, a signal representative of the binary value of the next higher order bit contained in stage 01, 46 is transmitted to a first input terminal 22 of all of the switching circuits in the middle column, 36*b*, 38*b* and 40*b*, via line 52. The signal representation of the binary value of the highest order bit, contained in stage 02, 48 is transmitted via the line 54 to a first input terminal 22 of all of the switching circuits in the rightmost column, 36*c*, 38*c* and 40*c*. Pulse source 56 which can be of any type well-known in the art has as an output a positive going current pulse on line 58, is selectively connected through switch 60 to the switching circuits in the respective rows. With the switch 60 in the position as shown in the figure, pulse 62 from the pulse source 56 is transmitted to the second input terminal 24 of all of the switching circuits in the middle row of the array, 38*a*, 38*b* and 38*c*. With the switch in the position labeled 0, the bottom row of switching circuits will have the second input terminals 24, commonly connected to the pulse source and with the switch in position 2 the upper row of switching circuits have their second input terminals commonly connected to the pulse source. In this manner the pulse outputted by the pulse source 56 is selectively applied to one of the input terminals of all of the switching circuits in the respective rows and to only one row at a time.

The output register 64 is preferably one similar to the input register 42 wherein each of the stages 66, 68 and 70, respectively, labeled stage 00, stage 01 and stage 02 have bistable capabilities to store electrical representations of the binary value of data transferred thereto. Although not shown, means are provided to clear all these stages of the output register, that is, to reset all of the stages to a state representative of a binary "0." Further, each of the stages is adapted, in any well-known manner, to be set to the state representative of binary "1" in response to a positive pulse input signal applied thereto at the respective input terminals 72, 74 and 76. The output terminal 32 of one switching circuit in each column is coupled via diode 34 to the input terminals of each of the respective stages in the output register. Additionally, three switching circuits, a different one in each column, are commonly coupled to the input terminal of the same stage of the output register. For example, the output terminal of switching circuit 36*a*, which is in the leftmost column and bottom row, the output terminal of switching circuit 38*c* which is in the rightmost column and the middle row, and the output terminal of switching circuit 40*b* which is in the middle column and top row are all commonly connected via separate backward diodes 34 to input terminal 72 of the lowest digit order stage, stage 00, of the output register 64. As will be described subsequently in greater detail since only one of the rows is selectively energized at any one time, only one of the three switching circuits will apply a signal to a common output register stage input terminal at any given time. The backward diode 34 serves to isolate the switching circuits which are commonly coupled to an input terminal of an output register stage. This prevents the signal output of one switching circuit from feeding back to a different switching circuit to affect it in an undesirable manner.

In the embodiment of this invention shown in FIG. 1 a three row by three column matrix of switching circuits is used in combination with a three stage input register and a three stage output register, with the three switching circuits in the same column receiving an input signal from a common stage in the input register and three switching circuits, each of the latter three being in different rows and columns, being commonly coupled to the input of a single stage of the output register. Additionally, a shift control means, shown as pulse source 56, is selectively connected to the input terminals of three switching circuits, all of which are in the same row in the matrix array. The amount of desired shift, that is the number of places or stages which the data is to be shifted, is controlled by setting switch 60 to a position to provide the signal from pulse source 66 to the proper row. Each of the fixed contacts of the switch 60 which is selectively engaged with the movable arm is labeled in accordance with the number of positions the data is to be shifted. In the embodiment shown, the information contained in the input register 42 can be selectively shifted during transfer to the output register 64 either zero, one or two places as desired. Obviously, larger size data words would require word registers with greater bit capacity and a larger matrix as well as a switch 60 having more selective positions thereon. Also it is obvious that data can be shifted more than two places in the embodiment shown in FIG. 1, for example if a shift of four positions is desired, setting switch 60 to contact 1 will effect an end around shift of four places.

The operation of the instant invention can best be described by using an example. Assume originally the binary word 101, with the leftmost bit being the lowest order bit, is stored in the input register 42 in the corresponding digit order stages 44, 46 and 48. Also as sume that all of the stages in the output register 64 are initially cleared to the reset or binary "0" condition. Each of the stages in the input register, 00, 01 and 02 respectively, will output signal on their respective output lines 50, 52 and 54 indicative of the binary state of the stage. Stage 00 outputs on line 50 a signal of some positive voltage level, stage 01 outputs a signal of substantially zero or ground potential level, and stage 02 outputs a signal on line 54 of a level identical to that of stage 00. All of the switching circuits in the leftmost column and the rightmost column, *36a*, *38a*, *40a* and *36c*, *38c* and *40c*, therefore receive a positive level signal applied to one of the input terminals, 22, whereas all of the switching circuits in the middle column, *36b*, *38b* and *40b*, receive at input terminals 22 a signal of a level substantially zero or ground potential. The positive level input signal applied to input terminal 22 provides current through resistor 28 to the anode of tunnel diode 26 to place it in operational state on its characteristic curve, as shown in FIG. 2, as at point 12. The zero potential level of the signal applied to the middle column of switching circuits results in the tunnel diodes contained in said switching circuits to remain in the non-operative condition.

Assuming it is desired to shift the information contained in the inut register two places to the right end-around so that the initial contents of stage 00 will be shifted to stage 02, the contents of stage 01 to stage 00 and the contents of stage 02 to stage 01. The movable arm of switch 60 would be placed at position 2 so that positive pulse 62 from the pulse source 56 is applied to the second input terminal 24 of all of the switching circuits in the top row, *40a*, *40b* and *40c*. With this second positive input signal applied to the switching circuits *40a* and *40c* the tunnel diode loadline is as represented by 18 in FIG. 2 and the tunnel diode is then in the operational state as indicated by point 14 on the characteristic curve. All of the other switching circuits in the array including switching circuit *40b* in the top row will have at the most one positive input signal thereto. In response to the two positive input signals, switching circuits *40a* and *40c* will develop output signals at terminal 32 of a relatively high magnitude essentially equal to $V_2$ as shown in FIG. 2. Those switching circuits which receive only a single input signal or no input signal will produce outputs of a relatively low magnitude no greater than that as indicated by $V_1$ in FIG. 2. The backward diode 34 is selected such that the forward conducting voltage drop is somewhat greater than the magnitude of $V_1$ but considerably less than the magnitude of $V_2$. Those backward diodes which receive output signals of a magnitude of $V_1$ or less therefore appear as high impedances to those signals and a negligable signal appears at the input terminal of the corresponding stage in the output register 64. The signals developed by the switching circuits *40a* and *40c*, however, are of sufficient magnitude to overcome this forward drop of the backward diode and therefore are transmitted respectively to input terminals 76 of stage 02 and input terminal 74 of stage 01 of the output register to set said stages to a state representative of binary "1." The output signal from switching circuit *40b* which is coupled to input terminal 72 of stage 00 in the output register is ineffective to cause any switching of the state of that stage so it remains in the "0" state. Therefore, after the transmission of the information from the input register to the output register via the matrix array and as controlled by switch 60, the output register contains the binary word 011 respectively stored in stages 00, 01 and 02. The latter is the initial binary word contained in input register 42 shifted two places end around.

Although the embodiment shown in the FIG. 1 shows a mechanical switch 60 for controlling the shift amount by selectively enabling the desired row of switching circuits in the array, obviously an electronic switching device could be utilized. For example, a three stage ring counter with each row enabling signal line coupled to a different stage of the ring counter could be utilized. Alternatively, a shift count register could be utilized with means for translating the contents of the register to selectively enable the passing of the signal from the pulse source to the desired row of switching circuits.

Another alternative within contemplation of the instant invention is the use of bistable switching circuit in lieu of the monostable circuits described above. This would be achieved by selecting the impedances in conjunction with the magnitude of the input signals applied such that the loadline for a single input intersects the characteristic curve of the tunnel diode at two stable positions. Under that condition, with one signal input applied to the switching circuit the tunnel diode would operate at a point of relatively low voltage similar to point 12 in FIG. 2. With the two inputs applied and tunnel diode would switch to a relatively high voltage operational state, similar to point 14, and upon subsequent removal of one of the input signals it would continue to operate at said relatively high voltage state. In order to return the switching circuit to its low voltage operating state, either both input signals would have to be removed prior to reapplying a single input signal or one of the input terminals would have to receive a signal of sufficient magnitude and proper polarity to drive the tunnel diode back to its first operational state. In using bistable switching circuits in the matrix array for selective shifting it would be necessary to reset all of the shifting circuits prior to initiation of each successive shifting operation. This is readily accomplished in the instant invention by clearing the input register stages prior to each successive shifting operation while no shift control input pulse is generated by pulse source 56. Since, in general, data processing systems require the clearing of a register prior to storing new data therein, the use of bistable switching circuits in the instant invention is readily adaptable to data processing since automatic resetting of the bistable switching circuits would occur as new data is placed in the input register.

Although preferably the input signal levels applied to the switching circuit input terminals are of equal magnitude and the impedances coupling said terminals to the tunnel diode are of equal values, no limitation thereto is intended. The respective input signal coupling impedances in conjunction with the magnitudes of the input signals applied to the respective input terminals need only be such as to provide for switching the tunnel diode to two different operational states. Additionally, although a diode, preferably a backward diode, is shown for coupling the output signal from the switching circuit, it is within contemplation of the instant invention that other impedance means could be utilized. For example, a resistor of properly chosen value to couple the "1" output signal from the switching circuit while still isolating the circuits from one another could be utilized.

In a circuit incorporating the teachings of this invention which was built and tested, the two operating states of the tunnel diode corresponding to points 12 and 14 of FIG. 2 were respectively approximately:

$$I_1=.7 \text{ ma.}, V_1=30 \text{ mv.}$$
$$I_2=.2 \text{ ma.}, V_2=400 \text{ mv.}$$

These figures point up the advantage of using a backward diode to couple the output signal to a utilization device. Other semiconductor diodes with approximately 400 mv. forward drop would attenuate the 400 mv. output signal to an unusable level but the lower drop of a backward diode, 90 mv. approximately in a typical case, substantially lessens the attenuation so that the output signal is maintained at a usable level.

It is understood that suitable modifications may be made in the structure as disclosed provided such modifications come within the spirit and scope of the appended claims. Having now, therefore, fully illustrated and described my invention, what I claim to be new and desire to protect by Letters Patent is:

1. A digital signal shifting circuit comprising: a plurality of switching circuits arranged in a matrix array of rows and columns; each of said switching circuits comprising two signal input terminals, an output terminal, a tunnel diode electrically operational in at least two different states, and impedance means electrically interconnecting said input terminals, said output terminal and one electrode of said tunnel diode; an input data storage register; an output data storage register; means connecting electrical signal representations of the data value of each different stage of the input register to a first input terminal of all of the switching circuits in respectively different columns; impedance means connecting the output terminal of different ones of the switching circuits in each column to a respectively different stage of said output data storage register; and means for selectively applying an electrical signal to the second input terminal of all of the switching circuits in any one row.

2. A shifting circuit as in claim 1 wherein said, tunnel diode is in one of its operational states only when both input signals are of predetermined energy levels.

3. Apparatus as in claim 2 wherein said one operational state is a high voltage level.

4. A shifting circuit as in claim 2 wherein said tunnel diode is in a different operational state when only one of said input signals is of said predetermined level.

5. Apparatus as in claim 4 wherein said different operational state is a low voltage level.

6. A circuit as in claim 1 wherein said tunnel diode operational states are at least a high voltage and a low voltage operational state.

7. Apparatus as in claim 6 wherein the ratio of said voltage levels is at least in the order of 10:1.

8. Apparatus as in claim 7 wherein said last mentioned impedance means comprises a diode adapted to pass signals of said high voltage and not to pass signals of said low voltage.

9. A digital signal transfer circuit comprising: a plurality of switching circuits arranged in an array of rows and columns; each of said switching circuits comprising two signal input terminals, an output terminal, a tunnel diode electrically operational in at least two different states, and impedance means electrically interconnecting said input terminals and one electrode of said tunnel diode; means for applying electrical signals to a first input terminal of all switching circuits in the respective columns; means for applying electrical signals to the second input terminal of all of the switching circuits in the respective rows; separate impedance means connected to the output terminal of each of the switching circuits; and electrical conducting means commonly connecting a different one of said latter impedance means in each column and row.

10. A circuit for selectively shifting an M bit binary number as many as N places, comprising: a plurality of switching circuits arranged in an array of M columns by N rows; each of said switching circuits consisting of two signal input terminals, an output terminal, a tunnel diode electrically operational in at least a high voltage state and a low voltage state, and impedance means electrically interconnecting said input terminals, said output terminal and one electrode of said tunnel diode; means commonly connected to a first input terminal of all N switching circuits in each of said columns for receiving signal representations of the binary value of the respectively corresponding M bits of the binary number to be shifted; means commonly connected to the second input terminal of all M switching circuits in each of said rows adapted to receive shift control signals; means for selectively applying shift control signals to said latter means in accordance with the number of places to be shifted; and impedance means connected to the output terminal of said switching circuits for coupling signal representations of the binary value of the M bits of said binary number in a shifted format.

References Cited by the Examiner

UNITED STATES PATENTS

| | | | |
|---|---|---|---|
| 3,076,181 | 1/1963 | Newhouse et al. | 340—166 |
| 3,078,376 | 2/1963 | Lewin | 307—88.5 |
| 3,097,312 | 7/1963 | Miller | 307—88.5 |

ROBERT C. BAILEY, *Primary Examiner.*

NEIL C. READ, *Examiner.*

P. XIARHOS, R. ZACHE, *Assistant Examiners.*